United States Patent [19]

Lowther

[11] Patent Number: 4,479,919

[45] Date of Patent: Oct. 30, 1984

[54] MULTIPLE FIRING EXPLODING FILM SYSTEMS

[75] Inventor: Frank E. Lowther, Chatsworth, Calif.

[73] Assignee: Atlantic Richfield Company, Los Angeles, Calif.

[21] Appl. No.: 454,506

[22] Filed: Dec. 29, 1982

[51] Int. Cl.³ .......................... B01J 3/08; B01J 19/02
[52] U.S. Cl. .................................. 422/127; 422/166;
422/186; 422/240; 422/241
[58] Field of Search ............... 422/127, 240, 241, 165,
422/166, 199, 186.04, 186; 75/0.5 C; 118/723,
725, 726

[56] References Cited

U.S. PATENT DOCUMENTS 3,068,337 12/1962 Kuebrich et al. ............... 118/726 X
3,634,040 1/1972 Johnson et al. ..................... 422/127
3,970,820 7/1976 Mahl .............................. 118/726 X

OTHER PUBLICATIONS

"The First Picosecond in an Exploding Wire", Moody L. Coffman, Proceedings of the Fourth Conference on the Exploding Wire Phenomenon, Boston, Oct. 1967.
"A Thermal Model of Wire Explosions in Methane", Siegel, Bernard and Johnson, Richard L., Proceedings at the Fourth Conference on the Exploding Wire Phenomenon, Boston, Oct. 1967.

Primary Examiner—Barry S. Richman
Assistant Examiner—Brion P. Heaney
Attorney, Agent, or Firm—Drude Faulconer

[57] ABSTRACT

A multi-firing exploding film system for enhancing a chemical and/or physical reaction which is capable of being fired several times without replacing the explodible element. The explodible element is formed of an explodible material, e.g. metal or semi-conductor material which is deposited as a film on the interior of a reactor. A pulse power supply is electrically connected to the film and is cyclically actuated to repeatably fire the explodible element upon demand. The present system basically functions as a continuous vaporization-deposition-revaporization process wherein at least a portion is vaporized upon each firing and is then recondensed onto the interior of the reactor before the next firing.

9 Claims, 6 Drawing Figures

MULTIPLE FIRING EXPLODING FILM SYSTEMS

BACKGROUND OF THE INVENTION

This invention relates to exploding wires and more particularly relates to chemical reaction chambers having multiple firing exploding wire systems for use in enhancing chemical and/or physical reactions.

Investigations have been made into the use of exploding wires or exploding bridge wires, as they are sometimes called, to enhance certain chemical reactions, see "A Thermal Model of Wire Explosions in Methane", B. Siegel and R. L. Johnson, Proceeding of the Fourth Conference on the Exploding Wire Phenomenon, held at Boston, Mass., Oct. 18–20, 1967.

The results of these investigations are encouraging in that exploding wires possess some truly unique features, such as: the capability of (a) injecting energies in the 10 kilocalories and greater per mole range in submicrosecond time intervals; (b) providing electrical to chemical conversion efficiencies much superior to those provided by other electrical sources, e.g. corona; and (c) producing energy which, in turn, imparts high velocity to the physical mass of those reactants in contact with the exploding wire.

To understand the basic premise involved in an exploding wire, one only has to consider the common electrical fuse. During normal operations, the current flowing through the fuse is not sufficient to cause a significant voltage drop across the fuse and the fuse therefore has no significant influence upon the overall electrical circuit. However, when the current through the fuse is increased to some value determined by the fuse characteristics, the voltage drop across the fuse becomes sufficient to melt the current conducting element (e.g. wire) in the fuse. This melting process opens up the electrical conduit and current can no longer flow until the fuse is replaced.

The exploding wire concept represents an extreme case of such an electrical fuse. Typically, a bank of electrical capacitors are charged to a high energy and voltage level. The charged bank is discharged, via an appropriate switch, through a series circuit that contains the element, i.e. wire, to be exploded. The current through the exploding wire is many orders of magnitude greater than that necessary to fuse the wire. The extreme resistive heating in the exploding wire causes a near instantaneous vaporization of the wire, itself. An energy balance reveals that the electrical energy stored on the capacitor is converted to useful energy in a variety of ways: (1) the wire is vaporized which requires energy to heat up the wire to its boiling temperature and to provide the latent heats of fusion and vaporization; (2) the wire atoms are given a considerable velocity (kinetic energy) due to the explosion; (3) a shock wave is produced in the surrounding atmosphere of the wire; (4) electromagnetic radiation is given off: e.g. optical, X-ray, infrared, ultraviolet, etc.; and (5) molecular bonds may be broken in the atmosphere around the wire.

As mentioned above, exploding wires of the type discussed have been used experimentally to enhance certain chemical and/or physical reactions. However, as far as it is known, exploding wires of this type have not been used for enhancing such processes on a commercial scale. This is believed to be due in part to the fact that a practical method for fast, repeatable firing of an exploding wire have heretofore been lacking. Since known exploding wires can only be fired once, substantial time must be spent in replacing the wire after each firing, thereby seriously detracting from the apparent advantages that an exploding wire system would otherwise afford to a commercial operation.

SUMMARY OF THE INVENTION

The present invention provides an exploding wire system for enhancing a chemical and/or physical reaction which is capable of being fired several times without requiring the replacement of the explodible element. In accordance with the present invention, an element formed of explodible material, e.g. metal or semi-conductor material, is deposited on the interior of a reactant chamber. A pulse power supply is electrically connected to the element and is cyclically actuated to repeatedly fire the explodible element.

The present system functions basically as a continuous vaporization-deposition-revaporization process wherein at least a portion of the explodible element is vaporized upon each firing but is then recondensed onto the interior of the chamber prior to the next firing. Long term attrition from multi-firing will normally reduce the explodible element to a point where it will have to be refurbished but the element will not have to be replaced after each firing as is the case with known exploding wires.

More specifically, in a first embodiment of the invention, the multi-firing exploding wire system comprises a cylndrical housing made of electrically insulative material, e.g. glass, ceramic, or the like, closed at both ends by electrically conductive caps. A layer or film of explodible material, e.g. metal or semi-conductor material, is deposited onto the inner surface of the cylindrical housing in good contact with each of the end caps. A pulse power supply is electrically connected to the end caps and supplies power upon demand to repeatably fire the explodible film. The housing has an inlet and an outlet therein by which chemical reactants can enter and exit the interior of the housing. The firing of the explodible film enhances the reaction between the reactants in the housing as will be explained in more detail below.

In the second embodiment of the present invention, a second explodible element is positioned within the housing similar to that of the first embodiment. A support rod is concentrically positioned within the housing and is coated with a second layer or film of explodible material. A pulse power supply is also electrically connected to the second film to repeatedly fire this second film. When the film on the inner surface of the housing and the second film on the rod are both fired, the two exploding films travel in opposite directions to "squeeze" and shear any reactant fluid molecules present in the housing thereby further enhancing the reaction being carried out in the housing.

In the third embodiment, the exploding film is deposited on the interior of the end caps instead of the interior of the housing, itself. Still further, in a fourth embodiment, individual power sources are respectively connected to individual end caps and a third power source is provided to supply a bias voltage between the films on the respective end caps. This arrangement provides a drift velocity to electrically charge the debris particles of exploding film that may be electrically charged to further enhance a reaction being carried out in the reactant chamber of the housing.

DESCRIPTION OF THE PREFERRED EMBODIMENTS

Figure 1:
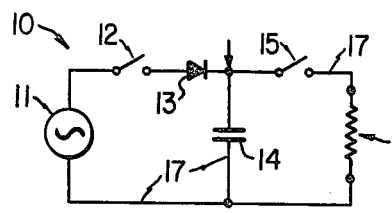
FIG. 1 is a schematic diagram of an exploding wire power circuit.

Referring more particularly to the drawings, FIG. 1 discloses a simplified schematic of a typical circuit 10 for supplying electric energy to an exploding wire system. Power is supplied by a high-voltage, alternating current source 11 which may be any of several, commercially-available power supplies which are capable of providing pulsed electrical energy in a programmable or selectable sequence, e.g. Model 606, High Power Pulse Generator, Cober Electronics, Stanford, Conn. Source 11 supplies power through switch 12 and diode 13 to capacitor bank 14. A second switch 15 connects capacitor bank 14 to an explodible element 16. All connecting leads 17 in circuit 10 are of adequate gauge copper or the like to insure that substantially all of the energy is transferred to element 16 upon firing.

The operation of circuit 10 for each firing cycle is as follows. Switch 12 is closed for a timed interval sufficient to fully charge capacitor bank 14 to its desired voltage. Switch 15 is then closed to discharge the energy stored in capacitor bank 14 into explodible element 16 which, in turn, explodes same. Switch 15 is then opened, explodible element 16 is replaced, and the procedure is then repeated. In employing such a system in connection with a commercial-type reactor to enhance a chemical and/or physical reaction being carried out therein, it should be apparent that the excessive amounts of time required for physically replacing the wire after such firing will likely offset any advantages otherwise gained by using an explodible element.

Figure 2:
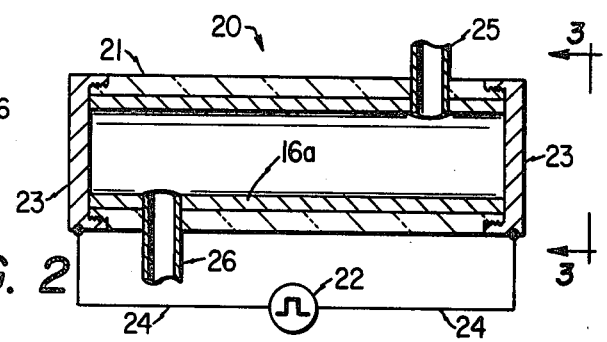
FIG. 2 is a sectional view of a first embodiment of a multi-firing exploding wire system in accordance with the present invention.
Figure 3:
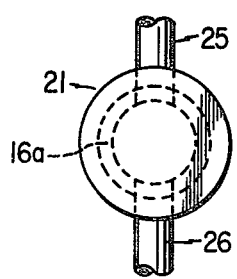
FIG. 3 is a view taken along line 3—3 of FIG. 2.

In accordance with the present invention, FIGS. 2 and 3 illustrate a first embodiment of a multi-firing exploding wire system which is to be used to enhance a chemical and/or physical reaction. As illustrated, this system is comprised of a reactor 20 having a cylindrical housing 21 which is constructed of an electric insulating material, e.g. glass, ceramic, or the like. The inner surface of housing 21 is coated with a layer of electrically-conducting, explodible film material 16a. Film 16a represents the element to be exploded (i.e. the "exploding wire") and is initially affixed to cylinder 21 by any one of several known and commercially-available techniques, e.g. vacuum deposition; sputtering; exploding wires, etc. Conducting film 16a may be a metal, e.g., copper, aluminum, platinum, gold, silver, lead, hafnium, or similar metallic material; alloys of such metals, or may be a semi-conductor material, e.g., germanium, silicon, carbon, or the like. Film layer 16a may be from a few angstroms to a few millimeters in thickness depending on the particular situation.

Pulse power supply 22 having circuits, capacitors, switches, etc. similar to those of FIG. 1 is attached to both electrically conductive caps 23 which, in turn, are threaded or otherwise attached to either end of housing 21 to close same. When in position, both caps 23 are in good electrical contact with film layer 16a.

Electrical energy from power supply 22 flows through leads 24 on demand to conductive end caps 23 at voltage and energy levels sufficient to substantially instantaneously vaporize film 16a or at least a portion thereof so that the atomic debris from exploding film 16a passes into the interior of housing 21. This debris as it cools is redeposited on the inner surface of housing 21 to substantially reform film layer 16a. Reactant fluids or the like are admitted into housing 21 through inlet 25 and the resulting products are drawn off through outlet 26.

In reactor 20 of FIG. 2, the degree of useful energy available will depend upon the excess energy supplied to film 16a. For example, if only enough energy is supplied to vaporize film 16a, then there will be little, if any, energy left over for useful work. If, however, considerable excess energy is supplied, then kinetic energy of the flying debris particles will be available to break chemical bonds of the reactant fluids upon collision. Depending upon the excess energy, optical energy, heat, shock waves, X-rays, etc. may also be generated which are useful to further enhance the reaction. The energy aspects will become more clear in the examples which follow later.

The operation of the exploding wire system in FIG. 2 can be described as a more or less continuous vaporization-deposition-revaporization process. Hot, flying film debris particles and related products collide with fluid atoms and molecules of the reactant within the housing 21 thereby causing chemical and/or physical reactions to occur. After the film debris particles have recondensed, film 16a is then ready to be re-exploded. It is possible, however, to provide a second firing prior to full recondensation of the products of the first firing. In this case, only enough energy is supplied on the first firing to explode only a portion of film layer 16a.

Long term attrition from multiple firings will normally reduce the amount of film 16a present. In some instances, film molecules will find their way out via the product stream. Other film molecules will be too cold to readhere on the reactor wall. Other film molecules may oxidize and precipitate out. Accordingly, film 16a may have to be refurbished from time to time by the methods previously used to form film layer 16a initially.

The energy per pulse, pulse firing rate, film composition, reactant flow rates, stoichiometry of reactants, etc. will be adjusted to optimize the particular process of interest. This will become clearer when the examples are discussed below. The multi-firing exploding wire system of the present invention is capable of performing useful functions in enhancing chemical and/or physical reactions in several different operational modes such as:

Mode 1. The hot, fast metallic atoms from the exploding film simply transfer kinetic energy to the fluid molecules surrounding the film. The net result is a convenient way to heat the reactants faster than is possible by other means.

Mode 2. The hot, fast metallic atoms from the exploding film simply transfer enough kinetic energy to "activate" a given chemical or physical reaction.

The exploding film supplies a "spark plug" action, so to speak.

Mode 3. The debris atoms from the exploding film may be by design, part of the reaction. Consider for example, a carbon (graphite) film and a hydrogen atmosphere, the reactor may be used to form hydrocarbon fuels, directly from carbon and hydrogen using only electricity.

Mode 4. The debris atoms merely provide a convenient method of exposing a large catalytic area. For example, it is known that surface adsorption is a part of all known catalytic actions. A one centimeter (cm) cube of platinum normally exposes only 6 cm of surface area. If exploded, however, the exposed surface area is increased by 10's of orders of magnitudes. This high area catalysis effect is obviously very useful during the exposure time of the catalyst in the surrounding reactants.

Mode 5. The exploding wire may be used as an extraction or separation element. For example, it may be desirable to extract a chemical portion of the reactant fluid. In this case, the film material may be selected such as to have a chemical affinity for certain chemical species in the input reactants.

Figure 4:
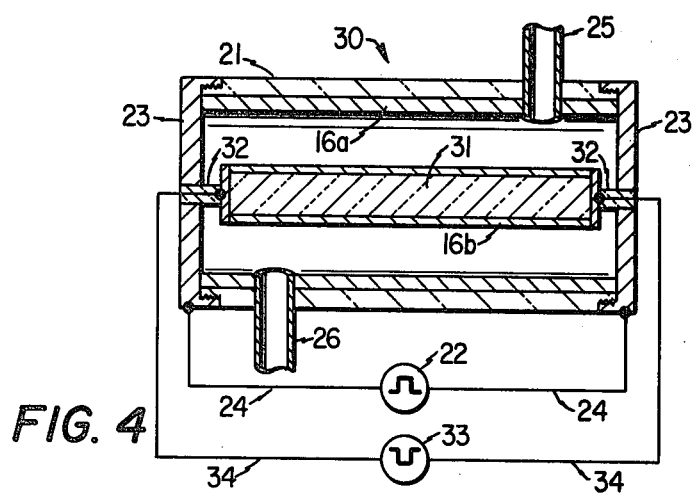
FIG. 4 is a sectional view of a second embodiment of a multi-firing exploding wire system in accordance with the present invention.

The multi-firing exploding wire system of the present invention may also be incorporated into other reactors of different configurations. FIG. 4 discloses a modification of reactor 20 (FIG. 2) wherein a second film is to be exploded within housing 21. Reactor 33 has a housing 21, end caps 23, film layer 16a, inlet 25, outlet 26, and pulse power source 22 the same as those of reactor 20. As illustrated in FIG. 4, support means, e.g. cylindrical rod 31 of an electrically insulative material, e.g. glass, ceramic, etc., is positioned concentrically in housing 21 by means of supports 32 or the like which extend through and caps 23 and which are also constructed of an electrically insulative material (e.g. glass, ceramic, etc.). Film layer 16b selected from the same materials as those which form film layer 16a is deposited on rod 31 by the same means as used to deposit layer 16a onto housing 21. A second pulse power supply 33, similar to power supply 22 supplies power through leads 34 to end plates 23 which, in turn, are affixed to rod 31 and in good electrical contact with film layer 16b. Leads 34 pass through the insulative supports 32 and accordingly are insulated from end caps 23.

In operation, film 16a is fired by power supply 22 and film 16b is fired by power supply 33. The two exploding films will travel in opposite directions and will "squeeze" and shear any reactant fluid molecules which may be present in reactor 30.

The two pulse power supplies, 22, 23, are shown in FIG. 4 as being out of phase. That is, the two exploding currents travel in opposite directions whereby the pinch effects of the two respective magnetic fields tend to cancel each other. In other cases, it may be desirable for the two magnetic fields to reinforce each other. In the latter situation, the two power supplies would be in phase. In other situations, by proper use of switches, a unitary power supply may be provided to do the job for both pulse power supplies shown in FIG. 4.

Figure 5:
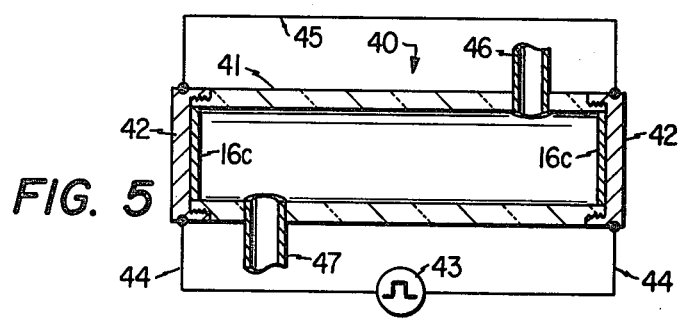
FIG. 5 is a sectional view of a third embodiment of a multi-firing exploding wire system in accordance with the present invention.

FIG. 5 discloses another reactor 40 in accordance with the present invention. Reactor 40 is comprised of a housing 41 made of electrically insulative material, e.g. glass, ceramic, etc., which has an inlet 46 and an outlet 47 therein and which is closed by electrically conductive end 42. A film layer 16c of the same material as that used for films 16a, 16b above, is deposited on the interior of each cap 42. Pulse power supply 43 is connected to each end cap 42 by leads 44. Electrical conductor 45 is connected at each end thereof to a respective end cap 42 to complete the circuit so that current from source 43 will pass through and explode both film layers 16c upon demand. The debris from the exploding films will travel in opposite directions and will tend to trade places upon condensation.

Figure 6:
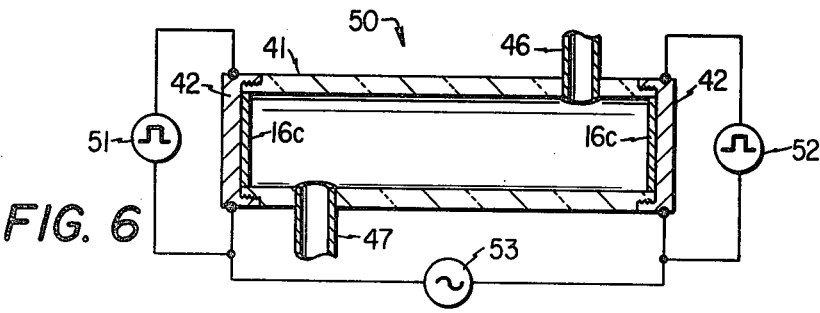
FIG. 6 is a sectional view of a fourth embodiment of a multi-firing exploding wire system in accordance with the present invention.

FIG. 6 discloses still another reactor 50 in accordance with the present invention. Basically, reactor 50 has a housing 41, end caps 42, films 16c, inlet 46, and outlet 47 the same as those of reactor 40 (FIG. 5). Individual power supplies 51, 52 are connected to respective end caps 42 so that one supply will explode film 16c on one end cap 42 and the other supply will explode the other film 16c. A third power supply 53 provides a bias voltage between the two films 16c. The purpose of power supply 53 is to provide a drift velocity to those debris particles of the exploding firm that are electrically charged. Power supply 53 which may be DC, AC, pulse, etc. may also provide a corona discharge within reactor 50.

While special cases may require other reactor shapes, cylindrical reactors have been illustrated since these are the cheapest to manufacture and easiest to use.

Various film materials take different amounts of energy to vaporize. The vaporization energy per mole converted to a per gram basis depends upon the molecular weight of the material used. In some cases the number of moles vaporized is critical and in others it is the number of grams that is important. Chart I below summarizes the vaporization energy for typical film materials and is useful in illustrating certain examples of the present invention. In general, the amount of energy required to heat up and fuse the film is much less than the heat of vaporization. Therefore, these lesser energy requirements are not included in Chart I. Energy requirements are also expressed in the familiar KWH/pound units. Thus, 0.61 KWH/pound for copper simply means that 0.61 KWH (Kilowatt-hours) of electrical energy is required to vaporize one pound of copper. Water is included in Chart I for reference purposes.

CHART I

| Material | Molecular Weight | KCal/mole | KCal/gram | KWH/pound |
|---|---|---|---|---|
| Copper | 63.5 | 72.8 | 1.15 | 0.61 |
| Graphite | 12 | 170 | 14.2 | 7.48 |
| Aluminum | 27 | 78.7 | 2.91 | 1.53 |
| Iron | 55.8 | 83.9 | 1.50 | 0.79 |
| Silicon | 28.1 | 71.0 | 2.53 | 1.33 |
| Germanium | 72.6 | 79.9 | 1.10 | 0.58 |
| Silver | 107.9 | 60.7 | 0.56 | 0.30 |
| Gold | 196.9 | 77.5 | 0.39 | 0.21 |
| Platinum | 195 | 122 | 0.63 | 0.33 |
| Lead | 207 | 42.9 | 0.21 | 0.11 |
| Zinc | 65.4 | 27.5 | 0.42 | 0.22 |
| Tin | 118.7 | 69.4 | 0.58 | 0.31 |
| Nickel | 58.7 | 88.9 | 1.51 | 0.80 |
| Hafnium | 178.5 | 158.0 | 0.89 | 0.47 |
| Water | 18 | 9.54 | 0.53 | 0.28 |

Certain other relationships will be useful in describing the examples to follow. The energy stored in an electrical capacitor is given by:

$$E = \tfrac{1}{2}CV^2 \tag{1}$$

where:
E = Stored energy (watt-seconds)

C=Capacitance (Farads)
V=Potential (Volts)
E×2.4×10⁻⁴=KCal.

The characteristic time (time constant) required to transfer the stored energy from the capacitor to a resistor load is:

$$T = RC \quad (2)$$

where:
T=Time constant (seconds)
R=Load resistance (ohms)
C=Capacitance (Farad).

The resistance of the load (films, wires, ,etc.) is:

$$R = rl/A \quad (3)$$

where:
R=Resistance (ohm)
r=Resistivity characteristic of the particular material (ohm-cm.)
l=Length of material (cm.)
A=Cross sectional area of material (cm.²)

EXAMPLE 1

A reactor similar to FIG. 2 is constructed wherein the overall length is 50 cm. and the outside diameter is 10 cm. A film of 1 mm. thick copper is deposited in the inner wall. Methane gas ($CH_4$) is admitted at a flow rate of 1 CFM at 3 atmospheres pressure. A 0.01 farad capacitor is charged to 2000 volts and then discharged through the film at the rate of 10 discharges per minute. The resulting product stream is rich in acetylene and hydrogen gas. The reactions involved is as follows:

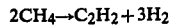

$$2CH_4 \rightarrow C_2H_2 + 3H_2$$

The energy stored on the capacitor is E=½×0.01×2000²=20,000 Joules=4.8 KCal.

This is adequate to vaporize about 4.8 or 4.17 grams of copper per pulse.

The resistance of the film is about 30×20⁻⁶ ohms. The discharge time therefore is about T=0.01×30×10⁻⁶=0.3 microseconds for this example.

EXAMPLE 2

A reactor similar to that shown in FIG. 5 is constructed where the films 16c are 2 cm. thick layers of graphite. Provision is made to admit hydrogen gas on a batch basis. The reactor is 20 cm. long and 5 cm. in diameter. A capacitor of 0.00001 farads is charged to 10,000 volts and then discharged through the graphite films. A portion of the exploded graphite combines with the hydrogen gas to form a hydrocarbon gas mixture rich in carbon-carbon double and triple bonds. A portion of the vaporized graphite is redeposited on the remaining films 16c after each firing.

EXAMPLE 3

Essentially crude oil is admitted into the reactor of FIG. 4. Energy per pulse is selected such that about 2% of films 16a and 16b are vaporized per pulse. The energy is sufficient to chemically and physically modify the crude oil charge, some of which is vaporized and cracked; some of which forms new double bond compounds of hydrogen and carbon; and some of which is unaffected. After about 10 discharges (a batch basis with aspect to the crude oil), the film is refurbished with fresh copper.

EXAMPLE 4

A reactor similar to the one shown in FIG. 4 is used to convert relatively impure (low-grade) silicon to semiconductor grade silicon. Films 16a and 16b are initially a low grade silicon. After a multiplicity of explosion-condensation-explosion-condensation cycles the new films 16a and 16b each become a much higher quality silicon. The product fluid stream is selected on the basis of the impurity that may be present in the initial silicon. For example, a hydrogen gas stream will tie up, as hydrogen sulfides, any sulfur in the vaporized silicon. Chlorine gas can be used to tie up any sodium present, etc. The pulse energy supplied is about 10 times the amount needed to vaporize the silicon.

Rod 31 with the purer silicon film 16b thereon is removed and the newly deposited silicon film is processed to recover the silicon. A new rod 31 with an impure film thereon is then placed in reactor 20. Since film 16a now is purer, the next cycle will proceed at a faster pace than the preceding cycle.

EXAMPLE 5

The previous examples, as described, all utilize a D.C. to pulse power supply. The main advantage to a D.C.-pulse method is that reaction time is extremely rapid (microsecond range). The disadvantage is that the rectifier and switch arrangement is relatively expensive.

Since the primary effect of this invention is to supply large amounts of $I^2R$ heating to a fusible element, it follows that A.C. (alternating current) may be used; in particular, 60 Hz energy. In simplest terms, a piece of copper thrown across a high power transmission line would be instantly vaporized or else the transmission line would suffer. The disadvantage of this method, i.e., direct use of commercial 60 Hz power, is that approximately ¼ cycle of the 60 Hz wave must pass before full current is applied. One quarter wave at 60 Hz amounts to 4 milliseconds or 4,000 microseconds. While this is fast by normal chemical reaction standards, it is slower than the microsecond reaction times available with the D.C. method.

The reactor of Example 1 is used to accept high voltage A.C. directly from 2100 volt power line in place of the energy from a charged capacitor. The A.C. energy is applied long enough for 3 full 60 Hz cycles to be administered per explosion of the film. The results will be similar to those of Example 1.

What is claimed is:
1. A multi-firing, exploding film system for enhancing chemical and/or physical reactions comprising:
   a reactor comprising a housing having an inlet and an outlet, said housing being constructed of an electrically insulative material;
   a first multi-firing, explodible film deposited on at least one interior surface of said housing; and
   means electrically connected to said first film for cyclically supplying electrical power upon demand to repeatably fire said first film, wherein said film is composed of a material which is capable of recondensing on the said interior surface of said housing after said film has exploded to provide a multi-firing capability.

2. The multi-firing, exploding film system of claim 1 wherein said housing comprises:

a cylindrical housing portion open at both ends having said inlet and said outlet therein, said cylindrical housing portion being constructed of an electrically insulative material;

an end cap of an electrically conductive material affixed to each end of said cylindrical housing portion to close said ends of said cylindrical housing portion;

and wherein said first film comprises:
a film of explodible material deposited on the interior surface of each of said end caps;
and wherein said means for firing said first film is electrically connected to each of said end caps.

3. The multi-firing, exploding film system of claim 2 wherein said means for firing said first film comprises:
a first pulse electrical power source electrically connected to one of said end caps;
a second pulse electrical power source electrically connected to the other of said end caps; and
a third electrical power supply connected to said first and second power sources.

4. The multi-firing exploding film system of claim 1 including:
a support mounted within said housing;
a second multi-firing, explodible film deposited on said support; and
means electrically connected to said second film for cyclically supplying electrical power upon demand to repeatably fire said second element.

5. The multi-firing exploding film system of claim 4 wherein said housing is cylindrical and wherein said first explodible film comprises:
a layer of explodible material deposited on the interior surface of said cylindrical housing; and
wherein said support comprises a cylindrical rod and wherein said second film comprises:
a layer of explodible material deposited on the outer surface of said rod.

6. The multi-firing, exploding film system of claim 5 wherein said first and second multi-firing, explodible films are comprised of a metal.

7. The multi-firing, exploding film system of claim 6 wherein said metal is selected from the following group: copper, aluminum, platinum, gold, silver, lead, hafnium, or alloys thereof.

8. The multi-firing, exploding film system of claim 5 wherein said first and second multi-firing, explodible films are comprised of a semi-conductor material.

9. The multi-firing, exploding film system of claim 8 wherein said semi-conductor material is selected from the following group: germanium, silicon, or carbon.

* * * * *